United States Patent [19]

Kearin et al.

[11] 4,102,768

[45] Jul. 25, 1978

[54] METAL OXIDE COATINGS

[75] Inventors: Martin John Kearin, Redditch; Robert Hiscutt, Birmingham; Peter Molineux, Bromsgrove, all of England

[73] Assignee: Triplex Safety Glass Company Limited, London, England

[21] Appl. No.: 845,771

[22] Filed: Oct. 26, 1977

Related U.S. Application Data

[63] Continuation of Ser. No. 419,836, Nov. 28, 1973, abandoned.

[30] Foreign Application Priority Data

Nov. 29, 1972 [GB] United Kingdom ............... 55156/72

[51] Int. Cl.² .......................................... C23C 15/00
[52] U.S. Cl. ................................. 204/192 P; 204/298
[58] Field of Search ........................... 204/192 P, 298

[56] References Cited

U.S. PATENT DOCUMENTS 4,006,070  2/1977  King et al. ........................... 204/298

Primary Examiner—O. R. Vertiz
Assistant Examiner—Wayne A. Langel
Attorney, Agent, or Firm—Burns, Doane, Swecker & Mathis

[57] ABSTRACT

A method and apparatus are disclosed for depositing transparent electrically-conductive metal oxide coatings or films, e.g. of indium/tin oxides, on non-conducting substrates, such as glass. The substrate may be a windscreen or window for an aircraft, on which the film provides an electrical resistance heating means for de-misting or de-icing. The film is reactively sputtered from a cathode assembly formed of substantially parallel strips of the metal, which is oscillated back and forth in a direction perpendicular to the length of the strips and substantially parallel to the substrate. Control of the thickness of the deposited film over the area of the substrate, e.g. for producing uniform heating over an irregular coated area of the substrate, is effected by bringing different effective areas of the cathode assembly over different parts of the substrate, by masking the cathode strips or by using a series of cathode strips which are tapered or which differ in width from one another.

56 Claims, 19 Drawing Figures

| Ω/sq | CATHODE WIDTH REQUIRED (INCHES) | GAP A IN MASK REQUIRED (INCHES) |
|---|---|---|
| 6 | 3.0 | 3.16 |
| 6 | 3.0 | 3.16 |
| 7 | 2.56 | 2.86 |
| 7 | 2.56 | 2.86 |
| 7.5 | 2.44 | 2.78 |
| 7.5 | 2.44 | 2.78 |
| 8 | 2.27 | 2.68 |
| 8 | 2.27 | 2.68 |
| 8.5 | 2.13 | 2.58 |
| 8.5 | 2.13 | 2.58 |
| 9 | 2.00 | 2.5 |
| 9.5 | 1.92 | 2.44 |
| 9.5 | 1.92 | 2.44 |
| 10 | 1.82 | 2.38 |
| 10.5 | 1.73 | 2.32 |
| 10.5 | 1.73 | 2.32 |
| 11 | 1.64 | 2.26 |
| 11 | 1.64 | 2.26 |
| 12 | 1.50 | 2.16 |
| 12 | 1.50 | 2.16 |
| 12 | 1.50 | 2.16 |
| 13 | 1.39 | 2.08 |
| 13 | 1.39 | 2.08 |
| 14 | 1.30 | 2.02 |
| 14 | 1.30 | 2.02 |
| 15 | 1.20 | 1.94 |
| 14 | 1.30 | 2.02 |
| 14 | 1.30 | 2.02 |
| 14 | 1.30 | 2.02 |
| 14 | 1.30 | 2.02 |

FIG.15.

ically-conductive metal oxide coatings on non-conducting substrates, such as glass, by reactive sputtering, and to articles having such coatings deposited on them. By way of example, the article may be a windscreen, e.g. an aircraft windscreen, on which the coating can provide electrical resistance heating means for de-misting or de-icing.

METAL OXIDE COATINGS

CROSS-REFERENCE TO RELATED APPLICATION

This is a continuation of application Ser. No. 419,836, filed Nov. 28, 1973, now abandoned.

This Application relates to a modification of the method and apparatus disclosed in the co-pending U.S. Application Ser. No. 220,899 of Robert David King and Robert Hiscutt, filed Jan. 26, 1972.

BACKGROUND OF THE INVENTION

1. Field of the Invention

This invention relates to methods and apparatus for depositing transparent, electrically-conductive metal oxide coatings on non-conducting substrates, such as glass, by reactive sputtering, and to articles having such coatings deposited on them. By way of example, the article may be a windscreen, e.g. an aircraft windscreen, on which the coating can provide electrical resistance heating means for de-misting or de-icing.

2. Description of the Prior Art

The method of reactive sputtering of a metal oxide coating on to a substrate is known, in which a substrate is maintained at a controlled elevated temperature in a vacuum vessel containing an atmosphere of oxygen and another gas or gases at a controlled reduced pressure, and a high negative potential is applied to a cathode assembly of the metal which is arranged in the vicinity of the substrate and presents a surface or surfaces extending substantially parallel to the substrate surface which is to be coated with the film.

When depositing such films on substrates of extended lateral dimensions (e.g. 30 cm. and upwards), in order to avoid undesirable variations in the characteristics of the film, it has been found necessary to take steps to provide access for the sputtering atmosphere to penetrate into the whole of the working space between the cathode assembly and the substrate, so as to maintain a substantial degree of uniformity in the oxygen concentration in the working space. One method of providing such access, as described and claimed in co-pending U.S. Patent Application Ser. No. 220,899, has been to divide the cathode assembly into spaced parallel strips so as to provide passages for the sputtering atmosphere between the strips, and to provide relative reciprocating movement between the strips and the substrate in a direction transverse to the length of the strips and parallel to the substrate surface, of an amplitude substantially smaller than the overall length of the cathode assembly but sufficient to cause all parts of the substrate surface to be coated by sputtering from at least one of said parallel strips for equal deposition periods during the deposition process. For example, the amplitude may be equal to the spacing between the centre lines of adjacent strips. For a substrate which is curved along its length, the strips may be reciprocated on similarly curved tracks. In this way it has been possible to deposit films of substantially uniform thickness and specific resistivity on relatively large substrates.

SUMMARY OF THE INVENTION

In some cases, it is desirable to be able to produce a controlled variation in the resistance of the deposited film over different areas of the substrate, e.g. to obtain uniformity of the resistance heating effect on substrates of non-rectangular shape, on which it is not possible to feed the current through parallel busbars of equal length. In other cases, where the substrate is curved in two directions, difficulty has still been experienced in maintaining uniformity of film thickness across the width of the substrate.

It is an object of the present invention to provide improved methods and apparatus by which the thickness of the deposited film can be controlled.

According to the present invention, we provide a method of depositing a transparent electrically-conductive metal oxide film on a non-conducting substrate by reactive sputtering from a cathode assembly formed of substantially parallel strips of the metal, which is oscillated back and forth in a direction perpendicular to the length of the strips and substantially parallel to the area of the substrate to be coated with the film, wherein control of the thickness of the deposited film over the substrate area is effected by bringing different effective areas of the cathode assembly into juxtaposition with different parts of the substrate area.

From another aspect, the invention resides in a method of depositing a transparent electrically-conductive metal oxide film on a non-conducting substrate by reactive sputtering from a cathode assembly formed of substantially parallel strips of the metal, which is oscillated back and forth in a direction perpendicular to the length of the strips and substantially parallel to the area of the substrate to be coated with the film, wherein the thickness of the deposited film is varied over the substrate area by so arranging the cathode strips that the effective width of the portions of cathode strip or strips traversed past any given area of the substrate is varied in accordance with the thickness of the film to be deposited on that area.

The variations of the effective width of the cathode strips may be effected by the use of masks applied to a series of equally-spaced cathode strips of similar dimensions to one another. The widths of the cathode strips exposed by the masks may vary along their length or the masks may expose different widths of successive cathode strips.

Alternatively the variations of the effective widths of the cathode strips may be effected by the use of a series of cathode strips which differ in width from one another, or by the use of a series of cathode strips which are tapered in width along their length.

The invention also resides in an apparatus for depositing a transparent electrically-conductive metal oxide film on a non-conducting substrate by reactive sputtering. Such apparatus comprises means for supporting a substrate, a cathode assembly including substantially parallel strips of the metal, means for oscillating the cathode assembly back and forth in a direction perpendicular to the length of the strips and substantially parallel to the position of the substrate, and means for varying the effective width of the portion of the cathode strip or strips which in use is or are traversed past any given area of the substrate.

The means for varying the effective width may comprise masks adapted to be fitted over the individual cathode strips, the strips being equally-spaced and of similar dimensions to one another. The masks may comprise, for each cathode strip, a pair of plate-like masks members mounted one on each side of the cathode strip in a plane parallel to but spaced from the emitting surface of the cathode strip, the effective width of the cathode strip being determined by the spacing between the facing edges of the plate-like mask members. In one embodiment of the invention, each of the plate-like members comprises a plurality of plate-like elements mounted so as to be capable of being individually shifted laterally of the cathode strip to adjust the effective width. Alternatively, the means for varying the effective width may comprise cathode strips which differ in width from one another while being mounted in the cathode assembly with their central axes spaced equal distances apart, or cathode strips which are tapered in width along their length. The invention also includes an article having a transparent, electrically-conductive metal oxide film deposited on a surface thereof by a method as defined above.

BRIEF DESCRIPTION OF THE DRAWINGS

FIG. 6A is a diagrammatic plan view similar to FIG. 6 of a cathode assembly comprising five parallel-sided cathode strips which differ in width from one another, FIG. 15 is a similar view of the same cathode strip but using the construction of FIG. 5 to adjust the width between the facing edges of the mask members.

DETAILED DESCRIPTION OF THE INVENTION

Figure 1:
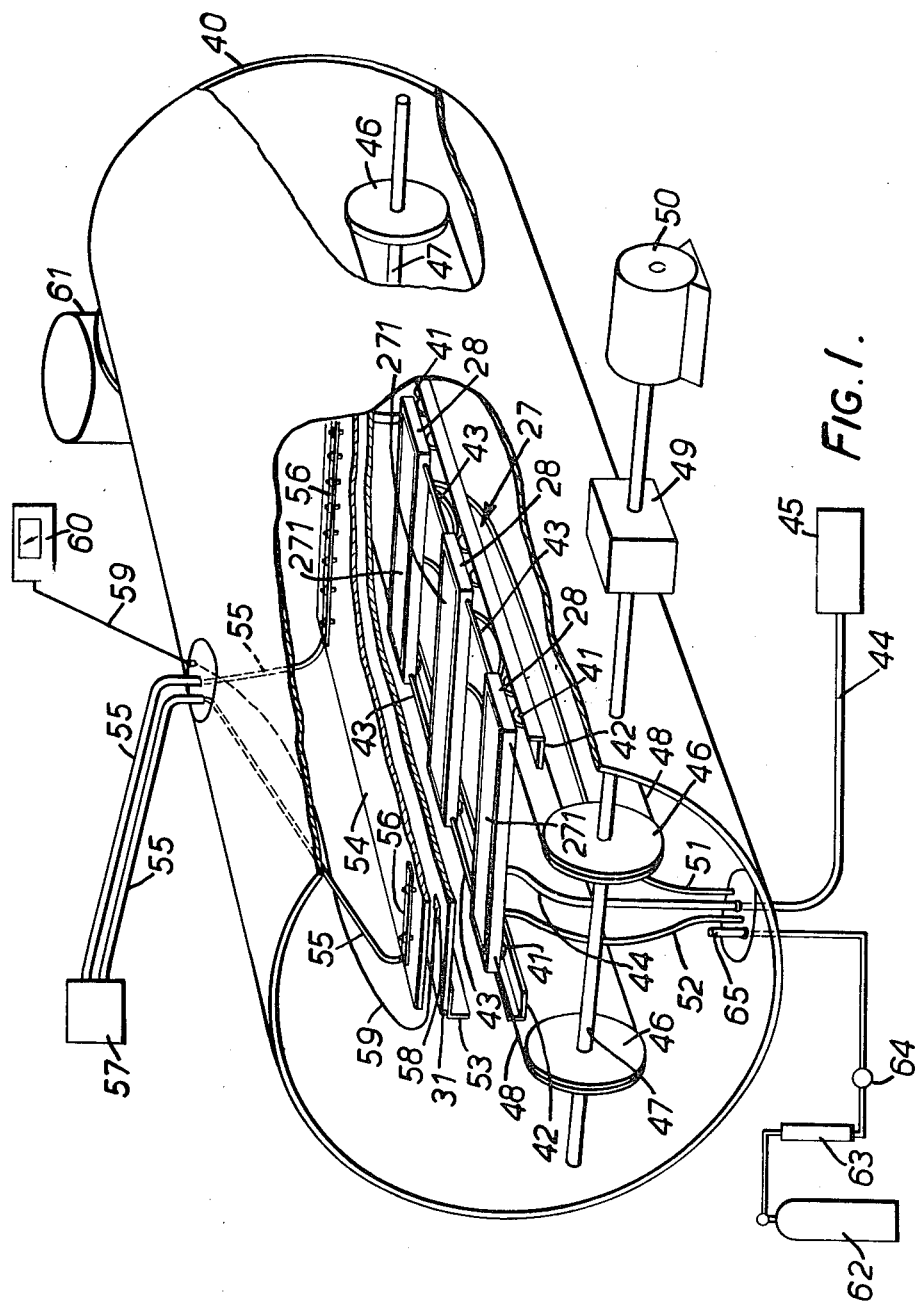
FIG. 1 is a perspective view of an apparatus for reactive sputtering of metal oxide films.

The apparatus shown in FIG. 1 comprises a cylindrical vacuum vessel 40 with removable vacuum-tight end closures (not shown). The cathode assembly 27 comprises a plurality of spaced, parallel sections or strips 271 having upper surfaces of indium/tin alloy containing between 75% and 95% indium and between 5% and 25% tin by weight. Each strip 271 has an earthed electrostatic shield 28. Only three sections or strips 271 are shown in FIG. 1, for clarity. In practice, the number of strips used will depend on the length of the substrate to be coated, being generally chosen so that an oscillation having an amplitude equal to the spacing between the centre lines of the strips will cause all parts of the substrate to be covered. The cathode strips 271 are arranged so as to be capable of presenting different effective cathode areas to different areas of a substrate. More specifically, they may be provided with means for varying the effective width of the individual cathode strips 271 as compared with one another, or for varying the effective width of the strips along their length.

Figure 3:
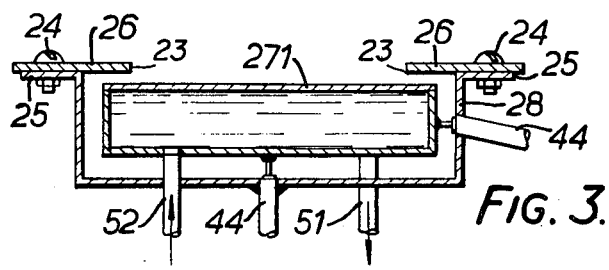
FIG. 3 is a section, to a larger scale, through one of the cathode strips of the apparatus of FIG. 1 or 2, with its associated earthed shield and masks.
Figure 4:
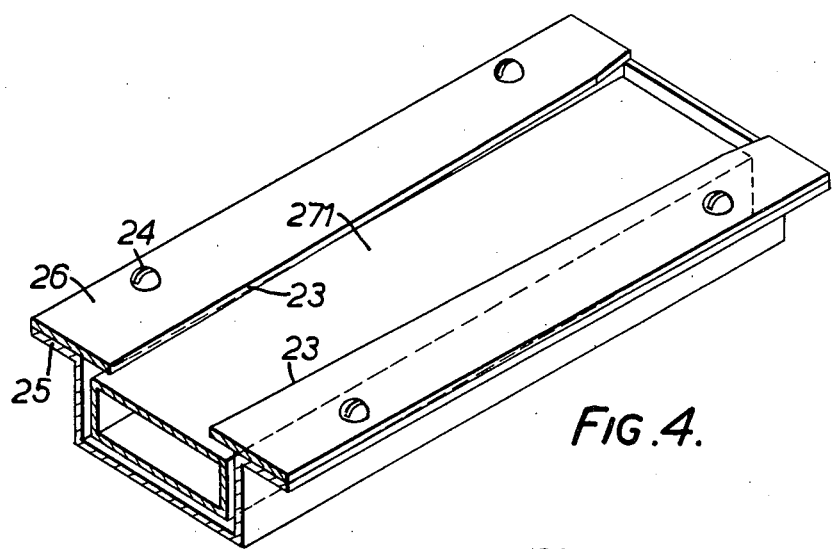
FIG. 4 is a perspective view of the cathode strip of FIG. 3.

In the embodiments shown in FIGS. 3 and 4, these means comprise masks, each in the form of a pair of plate-like members 26 secured by bolts 24 to outturned flanges 25 formed integrally with the vertical sides of the shield 28, so that the mask members 26 lie in a plane parallel with but spaced from the upper, emitting surface of the cathode strip 271. The effective width of the strip 271 is determined by the spacing between the facing edges 23 of the mask members 26.

Due to edge effects, the effective width of the cathode strip 271 exposed by the mask members 26 is less than the spacing between the facing edges 23 of the mask members 26. The effective exposed width of the cathode strip 271 depends on the spacing provided between the plane of the mask members 26 and the plane of the upper emitting surface of the cathode strip 271, the greater this spacing the less the effective exposed width of the cathode strip 271 as compared with the actual spacing between the facing edges 23 of the mask members 26.

The facing edges 23 of the mask members 26 may be parallel or, as shown in FIG. 4, they may diverge from one another so as to expose different widths of the strip 271 along its width. In the embodiment shown in FIG. 5, each mask is formed of a plurality of small adjustable plate-like elements 261 somewhat like piano keys, together making up a pair of mask members, each element 261 being secured to the flange 25 by means of a respective bolt 241 passing through a slot 262 in the element 261, so that by releasing the bolts 241 the elements 261 can be shifted laterally of the cathode strip 271 to adjust the exposed width.

The cathode strips 271 are mounted on pairs of rollers 41 (FIG. 1) at each of their ends, and these rollers run on horizontal guide rails 42 secured to opposite sides of the vessel 40. The strips 271 are connected to one another by adjustable link rods 43 which maintain the spacing and parallel alignment of the strips with one another and ensure that all the strips can move together along the guide rails in the direction perpendicular to their length. A flexible high tension lead 44 connects the strips 271 to the negative terminal of a high-voltage source 45.

A pair of pulleys 46 is mounted on a transverse shaft 47 at each end of the vessel 40 and a pair of traction wires or cables 48 connected at each end to the electrostatic shields 28 of the end strips 271 are led over the pulleys 46 to form drive means. One of the shafts 47 passes through the wall of the vessel 40 and is connected via a variable-amplitude oscillatory motion device 49 to an electric motor 50.

Figure 5:
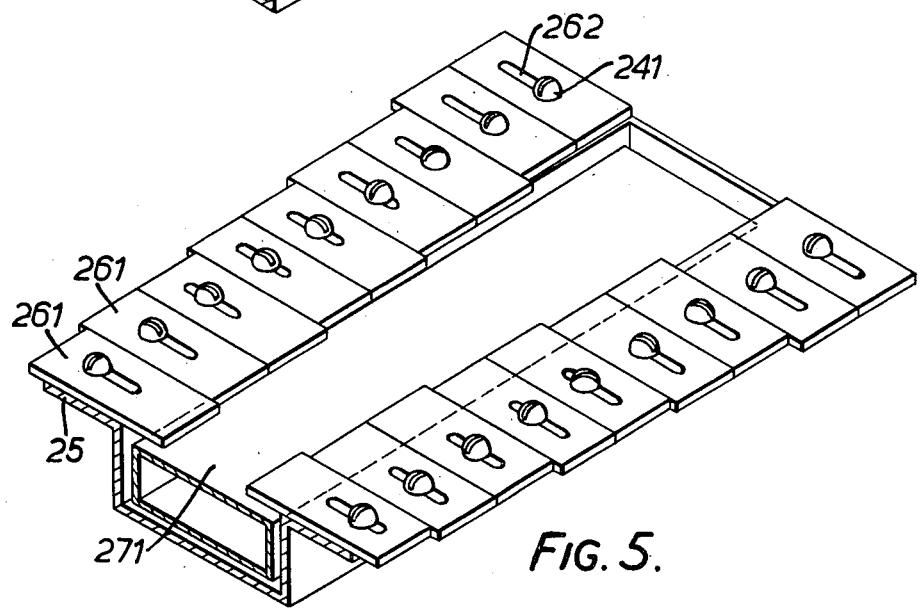
FIG. 5 is a similar view of a cathode strip with a modified form of mask.

Each of the strips 271 is hollow, as shown in FIGS. 3 to 5, its interior being filled with cooling water which is supplied through a flexible pipe 52 which enters near one end of the strip. The water leaves through a second flexible pipe 51 near the other end of the strip 271. The pipes 51, 52 connect the strips 271 in series, but the pipes extending between the adjacent strips have been omitted from FIG. 1 for clarity. The high-tension lead 44 from source 45 is of the co-axial cable type, the outer conductor being connected to the shield 28 and earthed. Similar cables 44 connect the strips 271 to one another.

Above the horizontal guide rails 42, a pair of horizontal support rails 53 (only one of which is shown) are secured to opposite sides of the vessel 40 to support a substrate 31 which is to be provided with a transparent conducting film of indium/tin oxide. The spacing between the substrate 31 and the upper surfaces of the cathode strips 271 is between 20 and 100 mm, preferably about 30 to 45 mm.

Above the position of the substrate 31, a radiant heater 54 is secured in the vessel 40, fed through low-tension leads 55 and busbars 56 from a low voltage power unit 57. The heater 54 extends over the whole area of the substrate 31.

A thermocouple 58 is placed on the upper surface of the substrate 31 and connected through leads 59 to a calibrated dial instrument 60 to indicate the temperature of the substrate.

A vacuum pump (not shown) is connected to the interior of the vessel 40 through an exhaust connection 61 and a gas supply 62 of the selected atmosphere is connected through a flow meter 63 and needle valve 64 to an inlet 65 opening into the vessel. The inlet 65 is at the opposite end of the vessel from the exhaust connection 61 so that gas flow from inlet to exhaust tends to pass through the working space between the cathode assembly and substrate and thereby assists in maintaining uniformity of the oxygen concentration in the working space.

In use, when the substrate 31 has been placed on the support rails 53 and the end closures have been sealed, the vessel 40 is evacuated through the exhaust connection 61 to a pressure of the order of $10^{-4}$ mm Hg and the selected sputtering atmosphere is supplied through the inlet 65, to bring the pressure in the vessel 40 to a value of the order of $10^{-2}$ mm Hg, while the substrate is heated to the desired temperature of between 240° and 400° C (preferably between 270° and 350° C) by the heater 54. The sputtering atmosphere may contain from 1 to 10% oxygen, and preferably between 2 and 6% oxygen, the remainder being an inert gas such as argon. The cathode assembly 27 comprising the strips 271 is oscillated back and forth along the guide rails 42 by the motor 50. The high negative voltage of between 1 and 5 KV, preferably between 2 and 3 KV, is applied to the strips 271 by the source 45. The vessel 40 and rails 42, 53, as well as the electrostatic shields 28, are earthed. A film of indium/tin oxides is thus sputtered on to the lower surface of the substrate 31. The heating effect on the substrate of the plasma in the working space is such that the heating current supply from the low voltage power unit has to be reduced to maintain the substrate temperature constant. It is found advisable to keep it within ±10° C of the desired value. An automatic control circuit of known type (not shown) can be used for this purpose.

The amplitude of the oscillatory motion of the strips 271 is usually adjusted to equal the spacing between the centre lines of the strips. This spacing can be adjusted by means of the link rods 43. The spaces between the strips 271 allow free circulation of the sputtering atmosphere so that no substantial oxygen gradient can become established in the working space between substrate 31 and cathode assembly 27.

Figure 2:
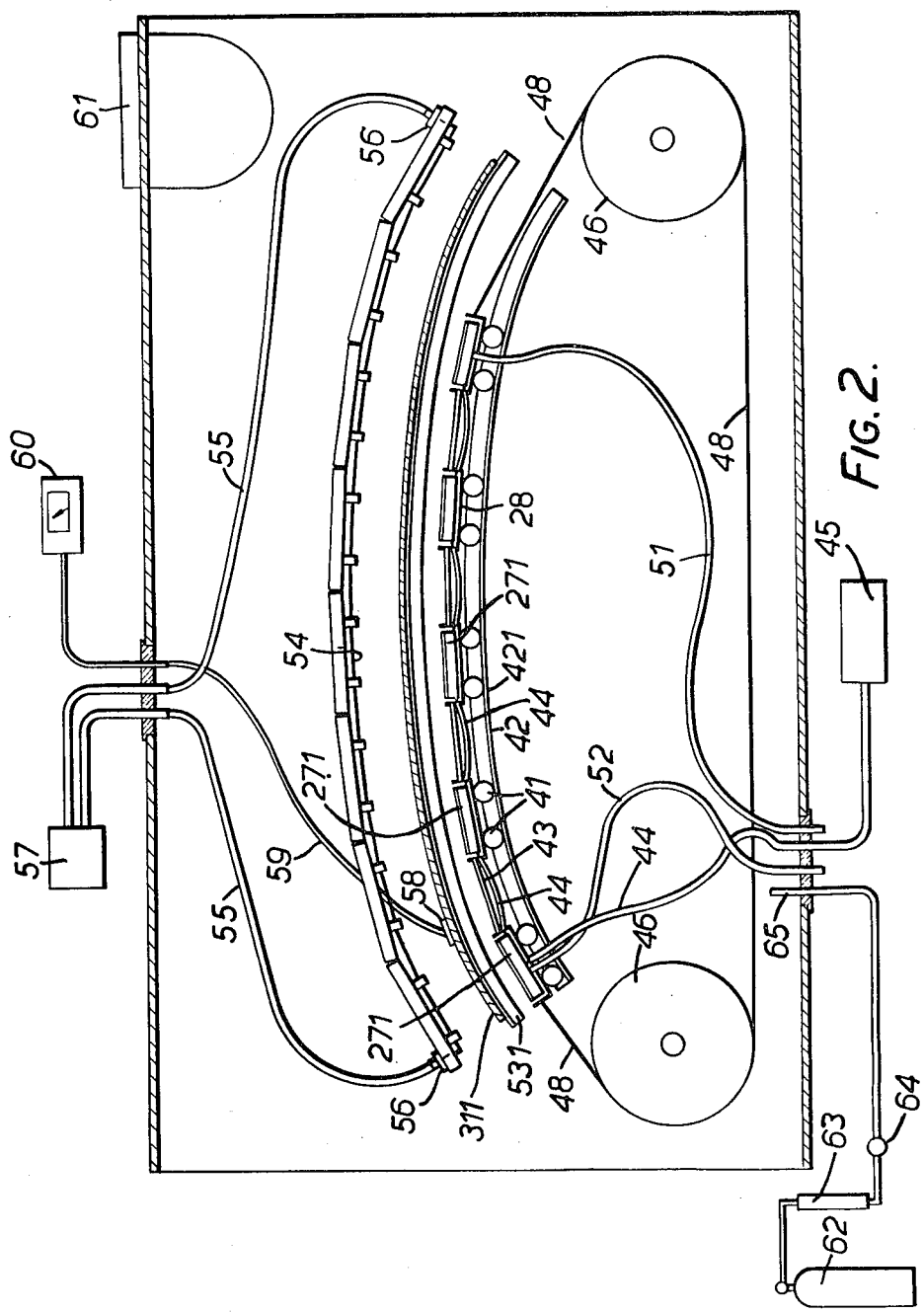
FIG. 2 is a part-sectional elevation of a modification of the apparatus of FIG. 1.

FIG. 2 illustrates a modification of the apparatus of FIG. 1 for use in depositing a film on to a substrate 311 which is curved from end to end, e.g. a windscreen for a motor vehicle. The support rails 531 and the guide rails 421 are similarly curved, as seen in elevation, and can be supported from the sides of the vacuum vessel 40 through separate brackets (not shown). The curvature of the guide rails 421 is such that the cathode sections or strips 271, shown here as being five in number, always remain parallel to the tangent to the adjacent portions of the substrate surface and at the required substantially constant distance from the surface, during their oscillatory movement. The heater 54 is formed in sections disposed on tangents to an arc which corresponds approximately to the curvature of the substrate 311. Other elements of the apparatus of FIG. 3 are similar to those of FIG. 1 and carry the same reference numerals.

Figure 6:
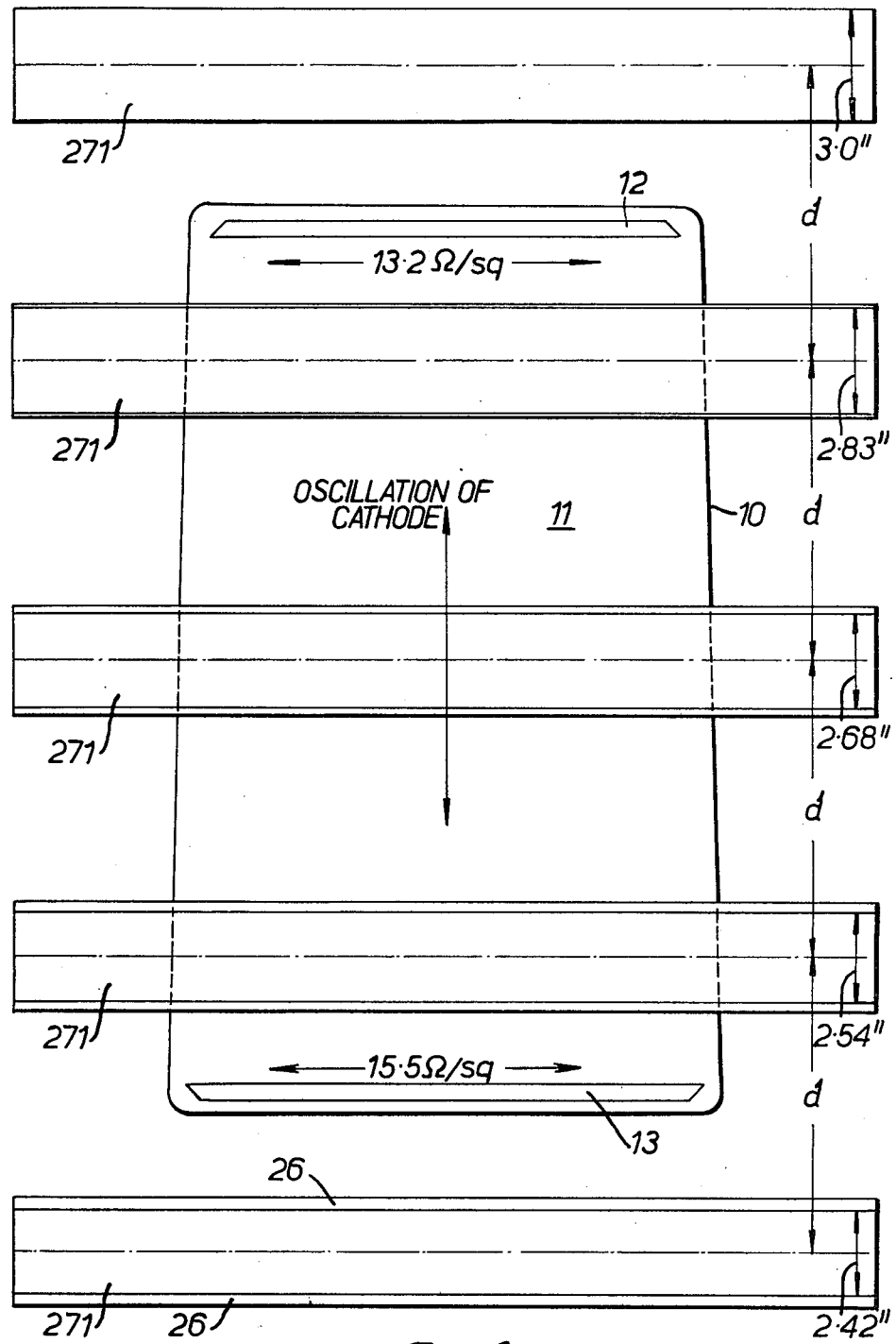
FIG. 6 is a diagrammatic plan view of a cathode assembly comprising five cathode strips, masked to expose differing widths of successive strips, arranged in the apparatus of FIG. 1, to traverse beneath an aircraft windscreen of trapezoidal outline shape.

FIG. 6 illustrates the application of a transparent conductive oxide coating to a trapezoidal aircraft windscreen 10 which has parallel upper and lower edges of different lengths. Using the apparatus of FIG. 1, an electrical resistance heating film is to be applied to the windscreen over the area 11 between busbars 12, 13 at top and bottom of the windscreen 10, through which electrical contact is to be made to the film. Since these busbars differ in length, it is necessary to have a gradation of the surface resistivity of the film from top to bottom if the heating effect is to be uniform over the whole area of the film. In the particular example illustrated, the required variation is from 13.2 ohms per square at the narrow end to .15.5 ohms per square at the opposite end. FIG. 6 also illustrates the cathode assembly designed to control the thickness of the film deposited, in accordance with the invention, so as to produce such gradation of the resistance. The cathode assembly comprises five parallel rectangular cathode strips 271 masked to expose differing widths of successive strips. In the specific example referred to, the effective widths of the five strips 271 calculated to be required for deposition of a film of the required gradation of resistivity are 3 inches, 2.83 inches, 2.68 inches, 2.54 inches and 2.42 inches. Due to the edge effects discussed above in relation to the embodiment of FIGS. 3 and 4, the actual widths required to be set between the opposed edges 23 of the masks 26 are somewhat greater than the above measurements. With a cathode-to-mask spacing of 5 mm., the actual widths required to be set between opposite edges 23 of the masks 26 are found to be 3.2 inches, 3.1 inches, 3.0 inches, 2.9 inches and 2.8 inches. The spacing $d$ between the centre lines of each of the adjacent strips is 8 inches. The oscillatory motion device 49 of FIG. 1 is adjusted to oscillate the whole cathode assembly back and forth parallel to the windscreen 10, which forms the substrate 31 of FIG. 1, in the direction perpendicular to the length of the strips 271 through an amplitude of 8 inches. The direction of the oscillatory movement is thus parallel to the direction of the desired gradation of the film.

Other particulars of this example are:
Cathode Composition — 12½% Tin, 87½% Indium
Spacing between Cathode and Substrate — 38 mm.
Ultimate Pumpdown Pressure — $1.5 \times 10^{-4}$ torr.
Sputtering Pressure — $6.5 \times 10^{-2}$ torr.
Gas Composition — 2.27% Oxygen, 97.3% Argon
Cathode Voltage — 2.65 kV
Cathode Current — 600 mA
Substrate Temperature — 335° C.
Preheat Time — 20 minutes
Sputter Time — 21 minutes.

The same result can of course be obtained by use of a set of parallel-sided cathode strips 271 of different width, as illustrated in FIG. 6A, without the use of masks 26.

Figure 7:
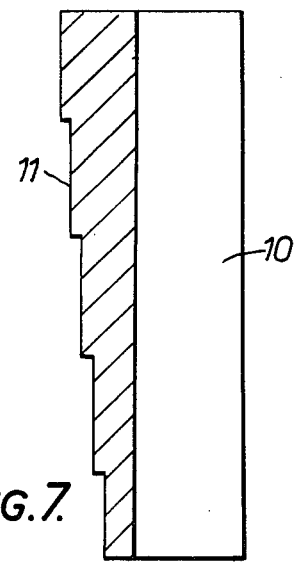
FIG. 7 is a diagrammatic section representing to an exaggerated scale the film produced on the windscreen by use of the cathode assembly of FIG. 6.

Due to the different exposed widths of the cathode strips, the thickness of the film deposited varies in a stepped manner, the thickest part of the film being deposited in the part covered by the widest strip 271 due to the greater effective cathode area which is brought into juxtaposition with this part of the windscreen 10. FIG. 7 illustrates diagrammatically the manner in which the thickness of the film deposited on the surface 11 is reduced in a stepped manner towards the part covered by the narrowest strip. The measured resistivity of the film and its gradation over the substrate area are in close agreement with the required values.

Figure 8:
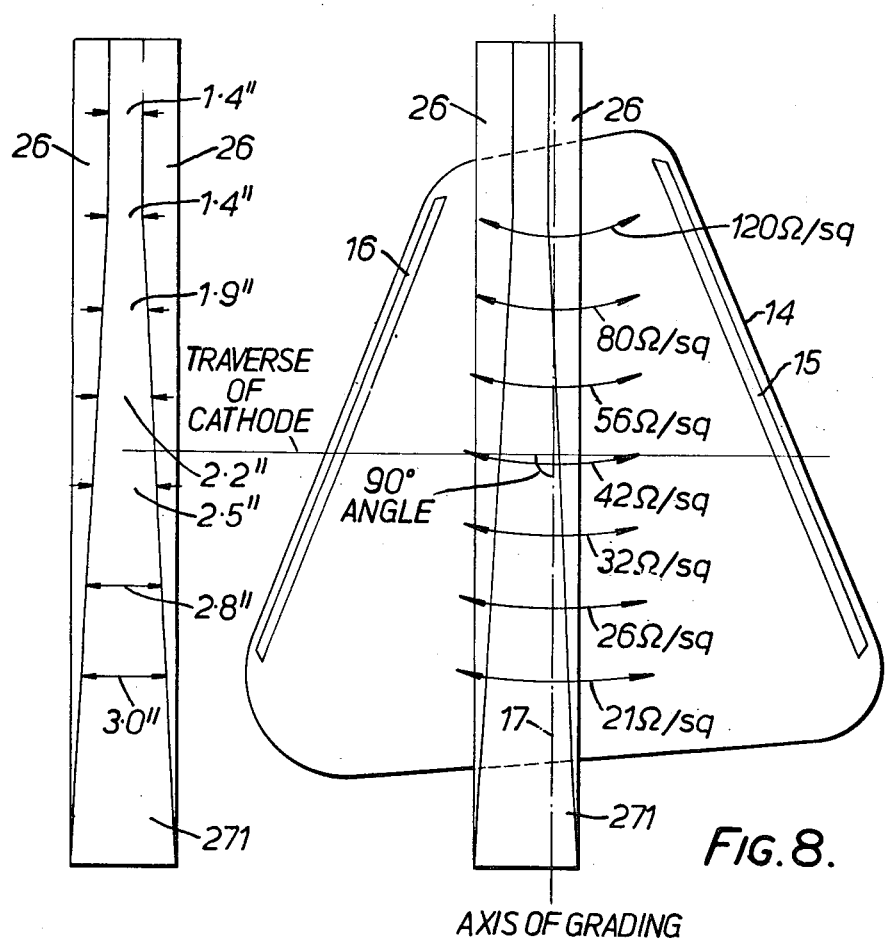
FIG. 8 is a diagrammatic plan view similar to FIG. 6, showing another aircraft window panel of more strongly tapered form, with the required variation of resistivity of the coating and the arrangement of the cathode assembly for achieving this variation.

This stepped variation of the thickness of the film, and consequently of the surface resistivity, is acceptable where the variation is not too great, as in the example of FIG. 6. Where the substrate departs more radically from rectangular form and a wide non-linear variation of resistivity is required, as in the example shown in FIG. 8, it may be advisable to use cathode strips whose effective width tapers along their length oscillated in a direction perpendicular to the axis of gradation, in order to obtain a smooth variation. In this example, the substrate is an aircraft window panel 14 of strongly tapered trapezoidal form, with busbars 15, 16 extending up its sides, i.e. along the converging edges. The surface resistivity is required to vary as shown from approximately 120 ohms/square at the top to 21 ohm/square at the bottom of the panel 14, in order that a heating current applied through the busbars 15, 16 shall produce an even heating effect over the area between. Only two cathode strips 271 are used in this case, provided with masks 26 as shown in FIG. 4. The effective width exposed between the facing edges of the masks varies as shown in FIG. 8 between 1.4 inches at the top end of the panel to 3.0 inches at the bottom. The panel 14 is disposed in the apparatus of FIG. 1 with the line 17 which forms the axis of the required grading of the film at 90° to the direction of traverse of the cathode assembly. The spacing between the cathode strips 271 and the amplitude of traverse is again 8 inches.

Figure 9:
FIG. 9 is a diagrammatic section similar to FIG. 7 illustrating the variation in thickness of the film produced on the panel by the cathode assembly of FIG. 8.

Other particulars of this example are:
Cathode Composition — 12½% Tin, 87½% Indium.
Cathode to Substrate Spacing — 38 mm.
Ultimate Pumpdown Pressure — $4 \times 10^{-3}$ torr.
Sputtering Pressure — $6.5 \times 10^{-2}$ torr.
Gas Composition — 2.34% Oxygen, 97.66% Argon
Cathode Voltage — 3.2 kV
Cathode Current — 300 mA
Substrate Temperature — 335° C
Preheat Time — 20 minutes
Sputter Time — 20 minutes The measured film resistance and its gradation are again very close to the specified requirements, varying from 23 ohm/square to 120 ohm/square, while the thickness of the film varies from about 500 A to 1600 A, both resistivity and thickness varying smoothly, i.e. without steps, as shown diagrammatically in FIG. 9.

Figure 11:
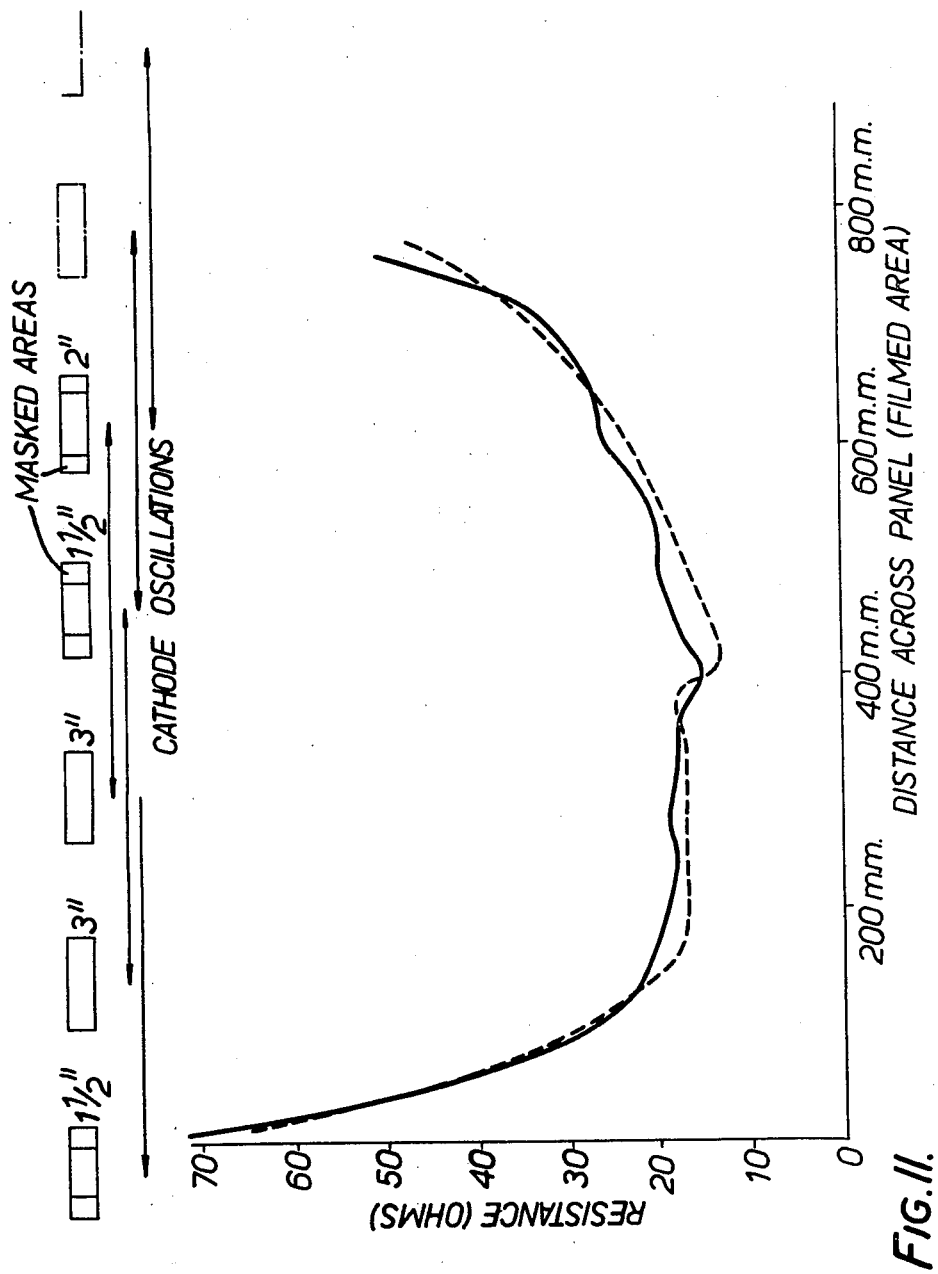
FIG. 11 is a graphical representation of the required resistivity and the values actually achieved on the panel of FIG. 10, also showing diagrammatically the form and oscillation of cathode assembly used.
Figure 10:
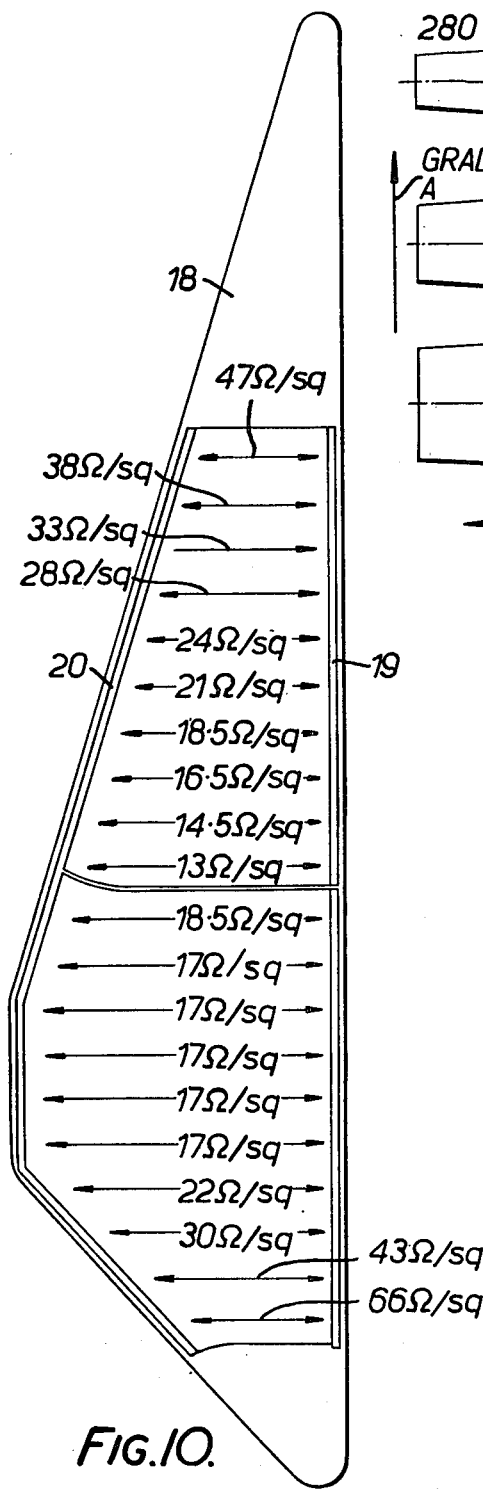
FIG. 10 is a diagrammatic view of a further aircraft window panel to be coated, showing the required variations in resistivity.

The method and apparatus of the invention can be adapted to provide quite complex variations in the gradation of the surface resistivity. FIG. 10 illustrates another aircraft window panel 18 of very elongated trapezoidal shape, which is to be provided with a transparent conductive oxide film on the area between busbars 19, 20. Due to the marked differences in the distance between the busbars along the length of the panel 18, the surface resistivity must vary from approximately 47 ohms/square at one end down to approximately 13 ohm/square near the middle. A "phase line" across the panel then requires a discontinuity in the required resistivity of the film which rises to 18.5 ohm/square, drops again to 17 ohm/square and finally rises to approximately 66 ohm/square at the other end of the panel. The dashed line in FIG. 11 shows the required gradation graphically.

Gradation of the film in accordance with these requirements could be achieved as in FIG. 8, by oscillating the cathode assembly at right angles to the axis of grading and using masks for the cathode strips of double-wedge shape tapering towards each end. A practical difficulty arises, however, in that the panel 18 would have to be disposed across the chamber 40 in order to traverse the strips 271 across its width. The apparatus may not always have sufficient width to enable this to be done.

To obtain a close approximation to the required grading, a cathode assembly of five cathode strips 271 is employed as in the case of FIG. 6, oscillating in a direction parallel to the length of the panel 18, i.e. parallel to the axis of grading. To reduce the coarseness of the step-function in the thickness and resistivity of the film, however, the amplitude of the oscillation is made twice the spacing between centre-lines of adjacent strips 271, as indicated diagrammatically in FIG. 11. As a result, each cathode strip influences areas of the substrate which are also influenced by the adjacent strip or strips, thus reducing the size of the steps. The effective widths of the strips 271 are determined in relation to the chosen amplitude of oscillation, of twice the spacing between centre-lines of adjacent strips, to give the required variation of resistance over the surface of the substrate. In this example, the cathode strips are masked to give effective widths of 2, 1½, 3, 3 and 1½ inches respectively.

The operational details are as follows:
Cathode Composition — 12½% Tin, 87½% Indium.
Cathode to Substrate Spacing — 38 mm.
Ultimate Pumpdown Pressure — $2 \times 10^{-4}$ torr.

Sputtering Pressure — 7 × 10$^{-2}$ torr.
Gas Composition — 3.56% Oxygen, 96.44% Argon
Cathode Voltage — −2.85 kV
Cathode Current — 1600 mA
Substrate Temperature — 335° C
Preheat Time — 25 minutes
Sputter Time — 14 minutes The solid line in FIG. 11 illustrates the actual gradation of the resistivity which is produced, quite closely agreeing with the required values indicated by the dashed line.

Figure 12:
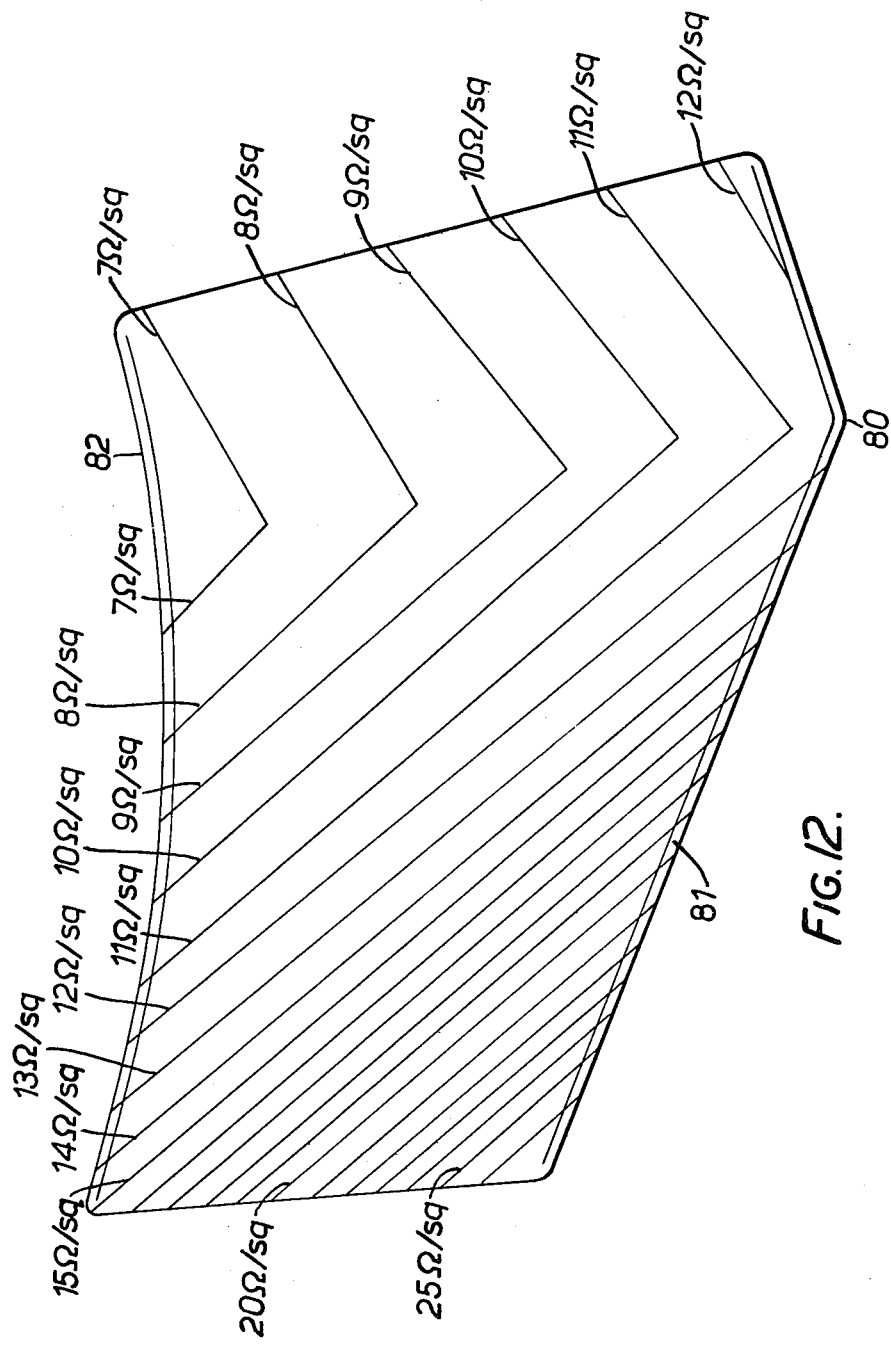
FIG. 12 is a diagrammatic view of another aircraft window panel to be coated, showing the required variations in resistivity by means of lines joining points of equal resistivity.
Figure 13:
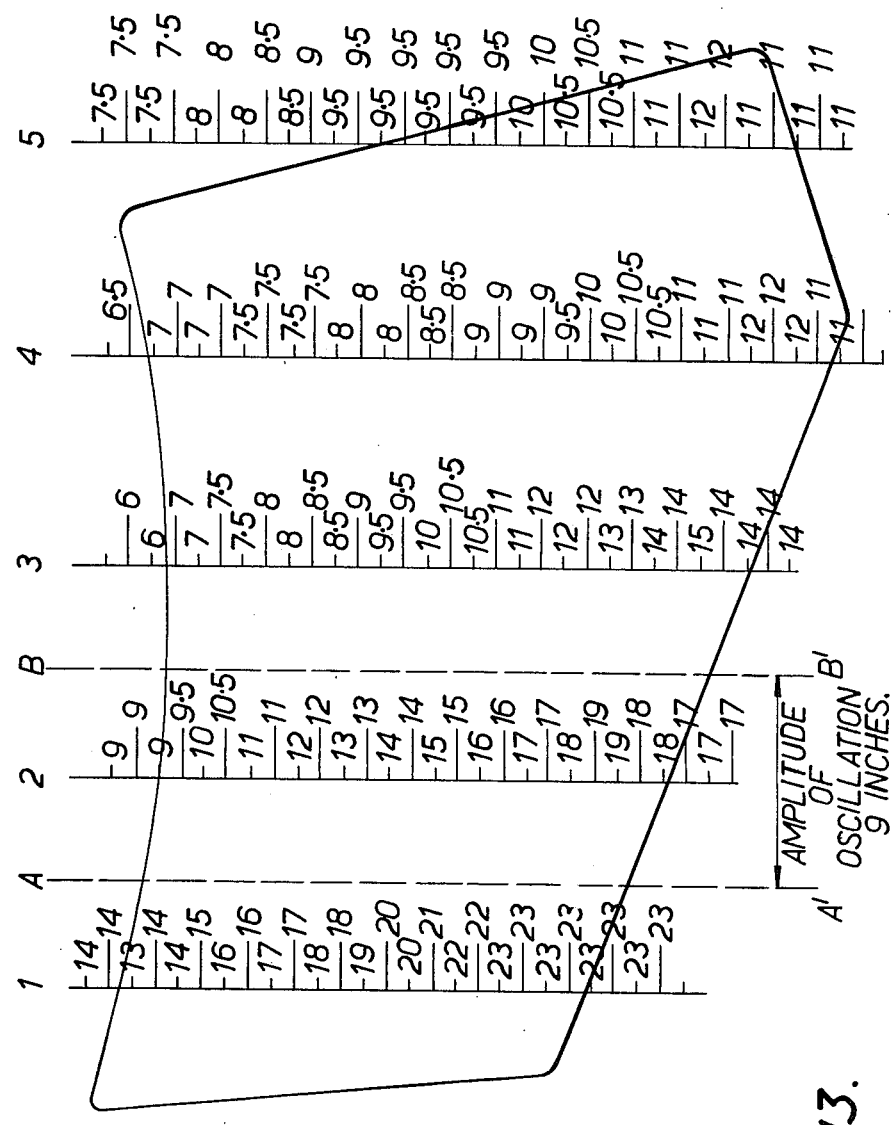
FIG. 13 is a diagram in which the centre lines of the cathode strips, in their mean positions, are superposed on the window panel outline, showing how the resistivity of the coating to be sputtered by each individual section of the cathode strips is determined.
Figure 14:
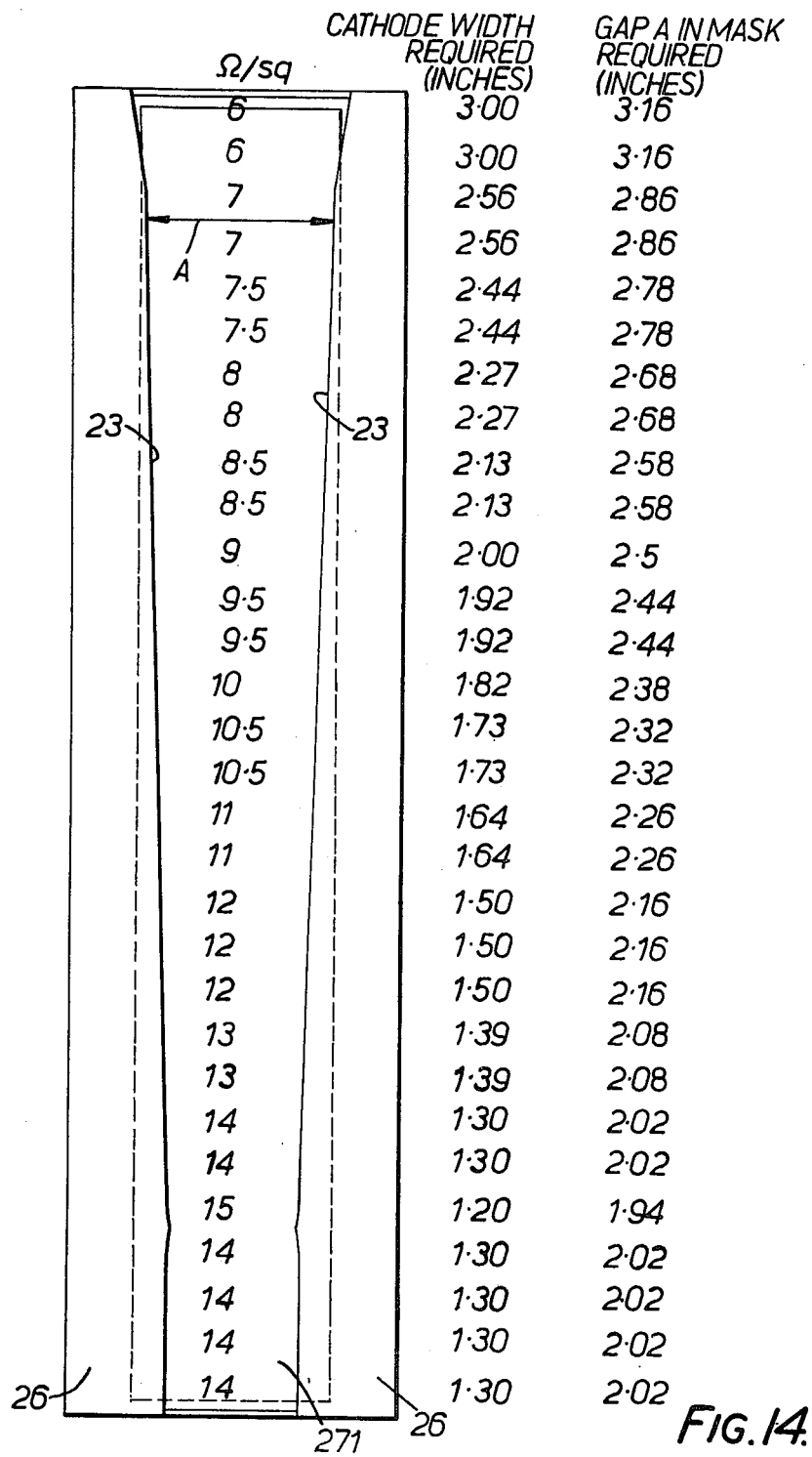
FIG. 14 is a plan view of one of the cathode strips, similar to that shown in FIG. 4, showing how the width between the facing edges of the mask members is related to the resistivity of the coating to be sputtered.

The aircraft window panel illustrated in FIG. 12 introduces a fresh complexity, in that the sharp bend 80 in the right-hand edge 81, combined with the curvature of the left-hand edge 82, requires variation of the resistivity of the coating in accordance with the illustrated sharply angled lines 83 joining points of equal resistivity, in order to achieve uniform power dissipation over the panel area. To deal with this problem, a cathode assembly 27 comprising five cathode strips 271, each of 3 inch width, is used, the spacing between centre-lines of adjacent strips 271 and the oscillation amplitude being equal at 9 inches, and the direction of oscillation being along the length of the panel as shown in FIG. 13. To calculate the resistivity of the coating required to be sputtered by each individual section of the cathode assembly, the mean positions of the centre-lines of the strips are drawn on the outline of the panel, as in FIG. 13. The second cathode strip from the left will thus sputter on to the area between lines A-A' and B-B', for example. For each interval of 1 inch along the centre-line, the average required surface resistivity in ohms/-square between A-A' and B-B' is calculated from FIG. 12, and the process is repeated for each cathode strip 271, resulting in the figures shown in FIG. 13. The effective width of cathode strip required to sputter a coating of the required resistivity is then calculated, having chosen the time of sputtering and other parameters so that the full 3 inch width of the cathode strips would give a resistivity of 6 ohms/square, which is the lowest figure required. Thus an effective width of 1½ inches would give 12 ohms/square and ¾ inch would give 24 ohms/square and so on. The mask members 26 are then shaped accordingly, as shown in FIG. 14, to expose the required varying width of the cathode strip 271 along its length. FIG. 14 also shows the required resistivity values, the effective cathode width required and the corresponding actual width A between the facing edges 23 of the mask members 26, for the third cathode from the left in FIG. 13. FIG. 15 illustrates how the mask construction of FIG. 5 can be adjusted to provide the same variation of exposed width.

Figure 16:
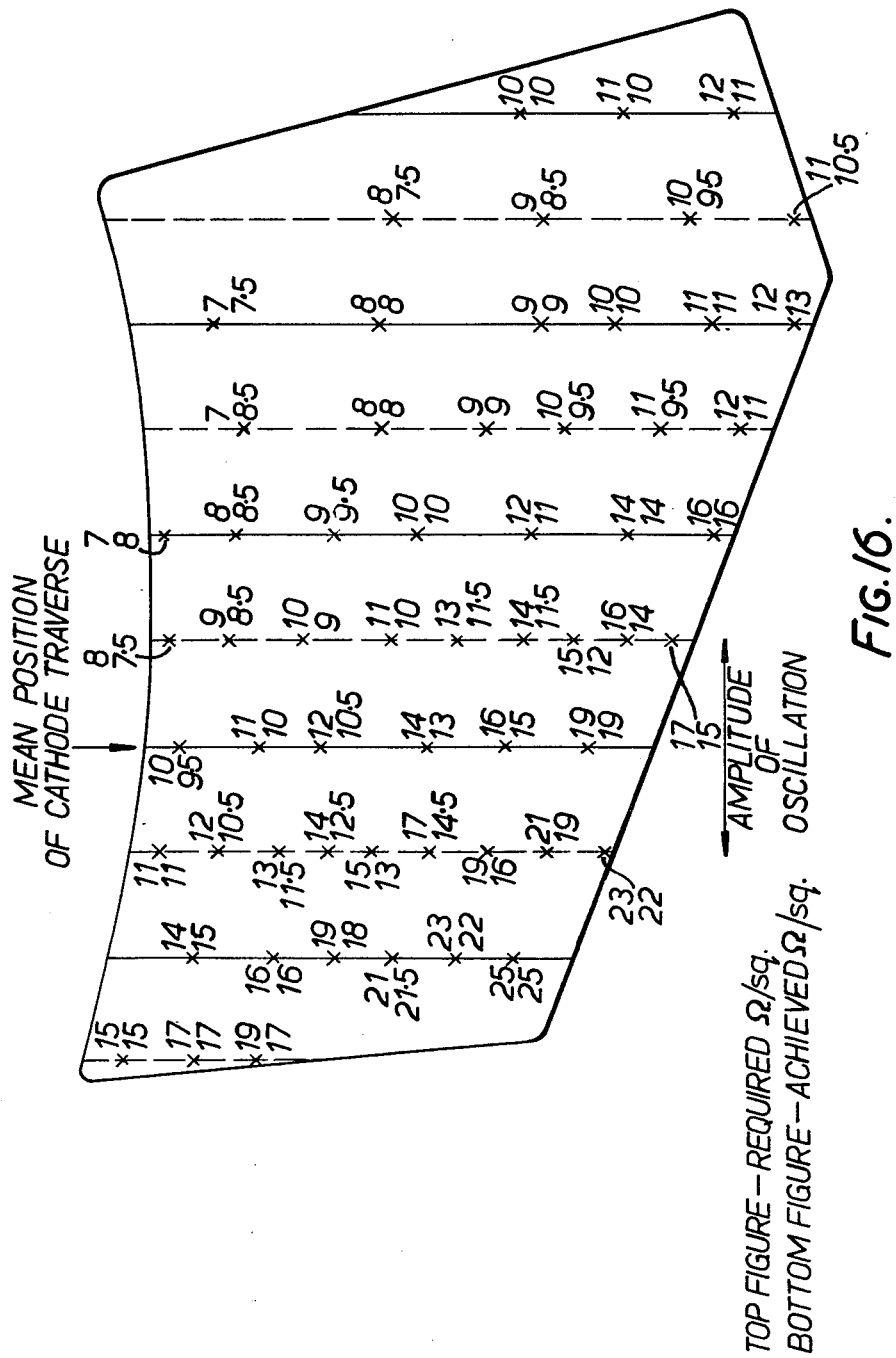
FIG. 16 is a view of the panel after sputtering showing the desired and actual values of resistivity measured at various points over the coated surface.

Operational details are as follows:
Cathode Composition — 12½% Tin, 87½% Indium
Cathode to Substrate Spacing — 38 mm.
Ultimate Pumpdown Pressure — 2 × 10$^{-4}$ torr.
Sputtering Pressure — 6.5 × 10$^{-2}$ torr.
Gas Composition — 3.3% Oxygen, 96.7% Argon
Cathode Voltage — −2.8 kV
Cathode Current — 1500 mA
Substrate Temperature — 340° C
Sputtering Time — 28 minutes FIG. 16 shows a plot of the desired and actual surface resistivities measured at various points on the panel by means of surface probes with an accuracy of about ±10%. The agreement between the desired and actual values is well within acceptable limits. When de-iced by electrical heating after artificial production of an ice coating at −20° C, the panel showed a uniform de-icing pattern indicating that the uniformity of power dissipation across the panel was good, as required.

Instead of using masks as illustrated in FIGS. 3, 4, 5, 6, 8, 14 and 15 to vary the effective width of the cathode strip or strips, it will be realised that the individual cathode strips may differ in width from one another, or may be formed so as to taper in width along their length. For example, they may be selected from a stock of parallel-sided strips of different widths and of tapered strips of differing angles of taper. In all cases, however, they are preferably mounted with their central axes spaced at equal distances apart.

Figure 17:
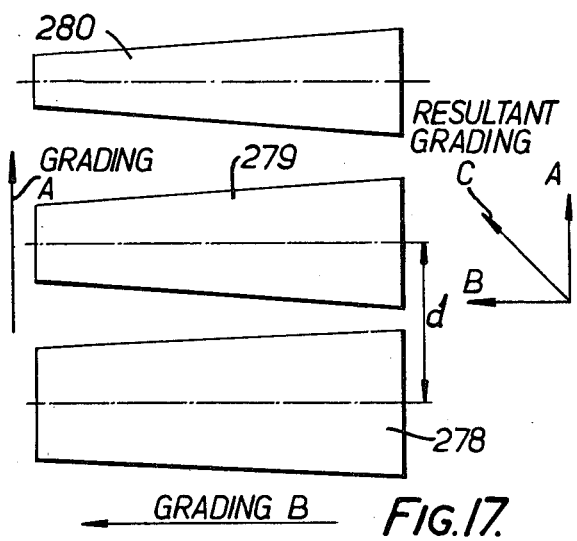
FIG. 17 is a diagrammatic illustration of a further alternative form of cathode assembly comprising three cathode strips which are tapered and which differ from one another in width.

FIG. 17 illustrates a further cathode assembly consisting of strips 278, 279, 280 which are both tapered in width along their length and diminished in width between successive strips. The spacing between the centre lines of adjacent strips again remains equal. With this cathode assembly, the thickness and resistance of the film are graded in the direction of arrow A by the diminution in width between successive strips and in the direction of arrow B by the tapering along the length of the strips, the resultant overall gradation being in a direction C which makes an angle between the direction of oscillation and the direction of the length of the strips.

Figure 18:
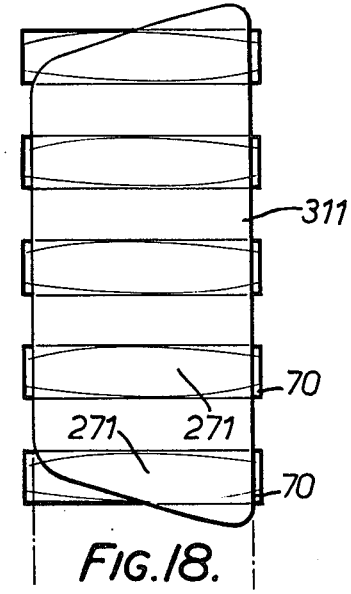
FIG. 18 is a diagrammatic plan view of another alternative form of cathode assembly using masks for coating a curved motor vehicle windscreen in the apparatus of FIG. 2.
Figure 19:
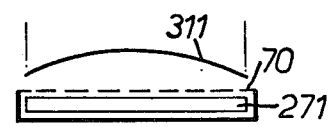
FIG. 19 is a diagrammatic view of the cathode assembly and substrate of FIG. 18.

FIGS. 18 and 19 illustrate the use of the invention for controlling the thickness of the deposited film to a uniform value, instead of grading it. The Figures show the application of a film of uniform thickness to a curved windscreen of a motor vehicle, using the apparatus of FIG. 2 with a set of equally-spaced rectangular cathode strips 271 of similar dimensions to one another. In this case, as may be seen from FIGS. 2 and 19, the windscreen is curved both along its length and across its width. It is known that, all other things being equal, the thickness of the film deposited will vary inversely with the spacing between the cathode and the substrate. The curvature of the rails 42 (FIG. 2) enables the cathode strips 271 to follow the longitudinal curvature of the windscreen 311, but the strips cannot readily be made to conform with the transverse curvature of the windscreen. To avoid the deposition of an excessive thickness of film on the longitudinal edges of the windscreen which are closest to the strips 271, masks 70 are provided which expose varying widths of the strips along their lengths, the minimum width being exposed at the ends of the strips, thus reducing the effective cathode area in juxtaposition with the longitudinal edges of the windscreen 311 so as to control the thickness of the film deposited thereon.

We claim:
1. In apparatus for depositing a transparent, electrically conducting, metal oxide film on the surface of a substrate of extended lateral dimensions, said apparatus comprising:
  (a) a vacuum chamber;
  (b) means for supporting a substrate in the vacuum chamber;
  (c) means for maintaining the substrate at a controlled elevated temperature in the vacuum chamber;
  (d) means for supplying a sputtering atmosphere of oxygen and another non-reactive gas or gases at a controlled reduced pressure into the vacuum chamber;
  (e) a cathode assembly whose overall lateral dimensions are not substantially less than those of the substrate, arranged substantially parallel to the substrate surface in the vacuum chamber and comprising a plurality of elongated, side-by-side strips of a metal capable of being reactively sputtered, said strips being spaced apart to define passages therebetween;

(f) means for applying a high negative potential to the cathode assembly so as to cause deposition of a metal oxide film on the substrate by reactive sputtering; and (g) means for oscillating the cathode assembly back and forth in a direction substantially parallel to the substrate surface and transverse to the length of the strips through an amplitude substantially smaller than the overal length of the cathode assembly;

the improvement comprising:

(h) means for controllably varying the thickness of the deposited film over the area of the substrate by bringing different effective widths of the cathode strips into juxtaposition with different parts of the area of the substrate in accordance with the thickness of film which is required to be deposited on the different parts of the area of the substrate, whereby the film has a controlled variation in resistance over the surface of the substrate.

2. Apparatus according to claim 1, wherein said means for controllably varying the thickness of the deposited film comprise cathode strips which differ in width from one another while being mounted in the cathode assembly with their central axes spaced equal distances apart.

3. Apparatus according to claim 1, wherein said means for controllably varying the thickness of the deposited film comprise cathode strips which are tapered in width along their length.

4. Apparatus recited in claim 1, including means for maintaining said strips substantially parallel during the sputtering process.

5. Apparatus according to claim 1, and further comprising earthed electrostatic shields each of which is closely spaced from a respective one of said cathode strips on the side of said other than that which faces the substrate-supporting means and wherein said means for controllably varying the thickness of the deposited film comprise plate-like masks for said cathode strips, each of said masks being secured to the electrostatic shield of the respective cathode strip, extending over a part of the cathode strip which faces the substrate-supporting means, and being spaced therefrom by about 5 mm.

6. Apparatus according to claim 1, wherein said means for controllably varying the thickness of the deposited film comprise masks adapted to be fitted over the individual cathode strips, said strips being equally spaced and of substantially equal dimensions to one another.

7. Apparatus according to claim 6, wherein the widths of the cathode strips exposed by the masks vary along the length of the strips.

8. Apparatus according to claim 6, wherein the masks expose different widths of successive cathode strips.

9. Apparatus according to claim 6, wherein the masks comprise, for each cathode strip, a pair of plate-like mask members mounted one on each side of the cathode strip in a plane parallel to but spaced from the emitting surface of the cathode strip, the effective width of the cathode strip being determined by the spacing between the facing edges of the plate-like mask members.

10. Apparatus according to claim 9, wherein each of the plate-like members comprises a plurality of plate-like elements mounted so as to be capable of being individually shifted laterally of the cathode strip to adjust the effective width.

11. Apparatus according to claim 1, and further comprising earthed electrostatic shields each of which is closely spaced from a respective one of said cathode strips on the side of said strip other than that which faces the substrate-supporting means and wherein said means for controllably varying the thickness of the deposited film comprise plate-like masks for said cathode strips, each of said masks being secured to the electrostatic shield of the respective cathode strip, extending over a part of the cathode strip which faces the substrate-supporting means, and being spaced therefrom.

12. Apparatus according to claim 11, wherein each of said plate-like mask members is spaced from the associated cathode strip by a distance of the same order as the spacing between the cathode strip and its electrostatic shield.

13. In apparatus for depositing a transparent, electrically conducting, metal oxide film on the surface of a substrate of extended lateral dimensions, said apparatus comprising:

(a) a vacuum chamber;

(b) means for supporting a substrate in the vacuum chamber;

(c) means for maintaining the substrate at a controlled elevated temperature in the vacuum chamber;

(d) means for supplying a sputtering atmosphere of oxygen and another non-reactive gas or gases at a controlled reduced pressure into the vacuum chamber;

(e) a cathode assembly, whose overall lateral dimensions are not substantially less than those of the substrate arranged substantially parallel to the substrate surface in the vacuum chamber and comprising a plurality of elongated, side-by-side cathode strips of a metal capable of being reactively sputtered, said strips being spaced apart to define passages therebetween;

(f) means for applying a high negative potential to the cathode assembly so as to cause deposition of a metal oxide film on the substrate by reactive sputtering; and (g) means for oscillating the cathode assembly back and forth in a direction substantially parallel to the substrate surface and transverse to the length of the strips through an amplitude substantially smaller than the overall length of the cathode assembly;

the improvement comprising (h) means for controllably varying the thickness of the deposited film over the area of the substrate by varying the effective width of each of the cathode strips along its length so as to provide that the effective width of each of the cathode strips at any point along its length, which point in use is traversed past and sputters onto a corresponding part of the area of the substrate, is such as to deposit a coating of required thickness on that part of the area of the substrate.

14. Apparatus according to claim 13, wherein said means for controllably varying the thickness of the deposited film comprise cathode strips which differ in width from one another while being mounted in the cathode assembly with their central axes spaced equal distances apart.

15. Apparatus according to claim 13, wherein said means for controllably varying the thickness of the deposited film comprise cathode strips which are tapered in width along their length.

16. Apparatus as recited in claim 13, including means for maintaining said strips substantially parallel during the sputtering process.

17. Apparatus according to claim 13, wherein said means for controllably varying the thickness of the deposited film comprise masks adapted to be fitted over the individual cathode strips, said strips being equally-spaced and of substantially equal dimensions to one another.

18. Apparatus according to claim 17, wherein the widths of the cathode strips exposed by the masks vary along the length of the strips.

19. Apparatus according to claim 17, wherein the masks expose different widths of successive cathode strips.

20. Apparatus according to claim 17, wherein the masks comprise, for each cathode strip, a pair of plate-like mask members mounted one on each side of the cathode strip in a plane parallel to but spaced from the emitting surface of the cathode strip, the effective width of the cathode strip being determined by the spacing between the facing edges of the plate-like mask members.

21. Apparatus according to claim 20, wherein each of the plate-like members comprises a plurality of plate-like elements mounted so as to be capable of being individually shifted laterally of the cathode strip to adjust the effective width.

22. In apparatus for depositing a transparent, electrically conducting, metal oxide film on the surface of a substrate of extended lateral dimensions, said apparatus comprising:
(a) a vacuum chamber;
(b) means for supporting a substrate in the vacuum chamber;
(c) means for maintaining the substrate at a controlled elevated temperature in the vacuum chamber;
(d) means for supplying a sputtering atmosphere of oxygen and another non-reactive gas or gases at a controlled reduced pressure into the vacuum chamber;
(e) a cathode assembly whose overall lateral dimensions are not substantially less than those of the substrate arranged substantially parallel to the substrate surface in the vacuum chamber and comprising a plurality of elongated, side-by-side cathode strips, each of which has an emitting surface of a metal capable of being reactively sputtered, said strips being spaced apart to define passages therebetween;
(f) means for applying a high negative potential to the cathode assembly so as to cause deposition of a metal oxide film on the substrate by reactive sputtering; and
(g) means for oscillating the cathode assembly back and forth in a direction substantially parallel to the substrate surface and transverse to the length of the strips through an amplitude substantially smaller than the overall length of the cathode assembly,
the improvement comprising:
(h) plate-like mask members mounted on at least one side of at least one of said cathode strips in a plane parallel to but spaced from the emitting surface of the cathode strip, the effective width of the cathode strip at points along its length being determined at such points by the extent of overlap of the plate-like mask members with the emitting surface of the cathode strip, whereby the thickness of the deposited film can be controllably varied over the area of the substrate by varying the extent of said overlap so as to provide that the effective width of the cathode strip at said points along its length, which points in use are traversed past and sputter on to corresponding parts of the substrate, is such as to deposit a coating of the required thickness on the corresponding parts of the substrate.

23. Apparatus according to claim 22, wherein said plate-like mask members are movably mounted on each side of at least one of said cathode strips, whereby the thickness of the deposited film can be controllably varied over the area of the substrate by varying the spacing between the facing edges of the plate-like mask members so as to provide that the effective width of each of the cathode strips at any point along its length, which point in use is traversed past and sputters on a corresponding part of the substrate, is such as to deposit a coating of the required thickness on that part of the area of the substrate.

24. Apparatus according to claim 22, and further comprising earthed electrostatic shields each of which is closely spaced from a respective one of said cathode strips on the side of said strip other than that which faces the substrate-support means and wherein said plate-like mask members are each secured to the electrostatic shield of the respective cathode strip, extend over a part of the emitting surface of the cathode strip, and are spaced therefrom by about 5 mm.

25. Apparatus according to claim 22, and further comprising earthed electrostatic shields each of which is closely spaced from a respective one of said cathode strips on the side of said strip other than that which faces the substrate-support means and wherein said plate-like mask members are each secured to the electrostatic shield of the respective cathode strip, extend over a part of the emitting surface of the cathode strip, and are spaced therefrom.

26. Apparatus according to claim 25, wherein each of said plate-like mask members is spaced from the associated cathode strip by a distance of the same order as the spacing between the cathode strip and its electrostatic shield.

27. In apparatus for depositing a transparent, electrically conducting, metal oxide film on the surface of a substrate of extended lateral dimensions, said apparatus comprising;
(a) a vacuum chamber;
(b) means for supporting a substrate in the vacuum chamber;
(c) means for maintaining the substrate at a controlled elevated temperature in the vacuum chamber;
(d) means for supplying a sputtering atmosphere of oxygen and another non-reactive gas or gases at a controlled reduced pressure into the vacuum chamber;
(e) a cathode assembly whose overall lateral dimensions are not substantially less than those of the substrate arranged substantially parallel to the substrate surface in the vacuum chamber and comprising a plurality of elongated side-by-side cathode strips, each of which has an emitting surface of a metal capable of being reactively sputtered, said strips being spaced apart to define passages therebetween;

(f) means for applying a high negative potential to the cathode assembly so as to cause deposition of a metal oxide film on the substrate by reactive sputtering; and (g) means for oscillating the cathode assembly back and forth in a direction substantially parallel to the substrate surface and transverse to the length of the strips through an amplitude substantially smaller than the overall length of the cathode assembly the improvement wherein:

(h) said cathode strips are tapered in width along their length, whereby the thickness of the deposited film can be controllably varied over the area of the substrate by providing that the effective width of each of the cathode strips at any point along its length, which point in use is traversed past and sputters on a corresponding part of the substrate, is such as to deposit a coating of required thickness on that part of the substrate.

28. In apparatus for depositing a transparent, electrically conducting, metal oxide film on the surface of a substrate of extended lateral dimensions, said apparatus comprising:

(a) a vacuum chamber;

(b) means for supporting a substrate in the vacuum chamber;

(c) means for maintaining the substrate at a controlled elevated temperature in the vacuum chamber;

(d) means for supplying a sputtering atmosphere of oxygen and another non-reactive gas or gases at a controlled reduced pressure into the vacuum chamber;

(e) a cathode assembly whose overall lateral dimensions are not substantially less than those of the substrate arranged substantially parallel to the substrate surface in the vacuum chamber and comprising a plurality of elongated, side-by-side cathode strips, each of which has an emitting surface of a metal capable of being reactively sputtered, said strips being spaced apart to define passages therebetween;

(f) means for applying a high negative potential to the cathode assembly so as to cause deposition of a metal oxide film on the substrate by reactive sputtering; and (g) means for oscillating the cathode assembly back and forth in a direction substantially parallel to the substrate surface and transverse to the length of the strips through an amplitude substantially smaller than the overall length of the cathode assembly, the improvement wherein:

(h) said cathode strips are parallel-sided but differ in width from one another, whereby the thickness of the deposited film can be controllably varied over the area of the substrate by providing that the width of each one of the cathode strips, which in use is traversed past and sputters on a corresponding part of the substrate, is such as to deposit a coating of the required thickness on that part of the substrate.

29. A method of depositing a transparent electrically-conductive metal oxide film on a non-conducting substrate by reactive sputtering from a cathode assembly which is substantially parallel to the area of the substrate to be coated with the film, and whose overall lateral dimensions are not substantially less than those of the substrate, and which is formed of a plurality of elongated, side-by-side spaced-apart strips of the metal, and which is oscillated back and forth in a direction substantially parallel to the said area of the substrate and transverse to the length of the strips, through an amplitude substantially smaller than the overall length of the cathode assembly, but sufficient to cause all parts of the substrate surface to be coated by sputtering from at least one of the strips during the deposition process, wherein control of the thickness of the deposited film over the substrate area is effected by bringing different effective widths of the cathode strips into juxtaposition with different parts of the substrate area.

30. A method according to claim 29, wherein the effective widths of the cathode strips are made different by the use of a series of cathode strips which differ in width from one another.

31. A method according to claim 29 wherein the effective widths of the cathode strips are made different by the use of a series of cathode strips which are tapered in width along their length.

32. A method as recited in claim 29, wherein said strips are maintained substantially parallel during the sputtering process.

33. A method according to claim 29, wherein the effective widths of the cathode strips are made different by the use of masks applied to a series of equally-spaced cathode strips having substantially equal dimensions to one another.

34. A method according to claim 33, wherein the widths of at least some of the cathode strips exposed by the masks vary along their length.

35. A method according to claim 33, wherein the masks expose different widths of successive cathode strips.

36. A method of depositing a transparent electrically-conductive metal oxide film on a non-conducting substrate by reactive sputtering from a cathode assembly which is substantially parallel to the area of the substrate to be coated with the film and whose overall lateral dimensions are not substantially less than those of the substrate, and which is formed of a plurality of elongated, side-by-side, spaced-apart strips of the metal, and which is oscillated back and forth in a direction substantially parallel to the said area of the substrate and transverse to the length of the strips, through an amplitude substantially smaller than the overall length of the cathode assembly, but sufficient to cause all parts of the substrate surface to be coated by sputtering from at least one of the strips during the deposition process, wherein the thickness of the deposited film is controllably varied over the substrate area by varying the effective width of each of the cathode strips along its length so as to provide that the effective width of each of the cathode strips at any point along its length, which point in use is traversed past and sputters onto a corresponding part of the area of the substrate, is such as to deposit a coating of required thickness on that part of the area of the substrate.

37. A method as recited in claim 36 wherein said strips are maintained substantially parallel during the sputtering process.

38. A method according to claim 36, wherein the effective widths of the cathode strips are varied by the use of a series of cathode strips which differ in width from one another.

39. A method according to claim 36, wherein the effective widths of the cathode strips are varied by the use of a series of cathode strips which are tapered in width along their length.

40. A method according to claim 36, wherein the effective widths of the cathode strips are varied by the use of masks applied to a series of equally-spaced cathode strips having substantially equal dimensions to one another.

41. A method according to claim 40, wherein the widths of at least some of the cathode strips exposed by the masks vary along their length.

42. A method according to claim 40, wherein the masks expose different widths of successive cathode strips.

43. In a method of depositing a transparent, electrically conducting, metal oxide film on to the surface of a substrate of extended lateral dimensions, said method comprising the steps of:
(a) arranging a cathode assembly whose overall lateral dimensions are not substantially less than those of the substrate in the vicinity of the substrate and substantially parallel thereto, but spaced apart therefrom so as to define a working space between the cathode assembly and the substrate surface, the cathode assembly comprising a plurality of elongated, side-by-side strips comprising a metal capable of being reactively sputtered, said strips being spaced apart to define passages therebetween:
(b) enclosing the cathode assembly and the substrate within a vacuum chamber containing a sputtering atmosphere of oxygen and another non-reactive gas or gases at a controlled reduced pressure;
(c) maintaining the substrate at a controlled elevated temperature in the vacuum chamber;
(d) applying a high negative potential to the cathode assembly so as to cause deposition of a metal oxide film on the substrate by reactive sputtering; and
(e) oscillating the cathode assembly back and forth in a direction substantially parallel to the area of the substrate to be coated with the film and transverse to the length of the strips through an amplitude substantially smaller than the overall length of the cathode assembly;
the improvement comprising:
(f) controllably varying the thickness of the deposited film over the area of the substrate by bringing different effective widths of the cathode strips into juxtaposition with different parts of the area of the substrate in accordance with the thickness of the film which is required to be deposited on the different parts of the area of the substrate, whereby the film has a controlled variation in resistance over the surface of the substrate.

44. A method according to claim 43, wherein the effective widths of the cathode strips are made different by the use of a series of cathode strips which differ in width from one another.

45. A method according to claim 43, wherein the effective widths of the cathode strips are made differnt by the use of a series of cathode strips which are tapered in width along their length.

46. A method as recited in claim 43 wherein said strips are maintained substantially parallel during the sputtering process.

47. A method according to claim 43, wherein the effective widths of the cathode strips are made different by the use of masks applied to a series of equally-spaced cathode strips having substantially equal dimensions to one another.

48. A method according to claim 47, wherein the widths of at least some of the cathode strips exposed by the masks vary along their length.

49. A method according to claim 47, wherein the masks expose different widths of successive cathode strips.

50. In a method of depositing a transparent, electrically conducting, metal oxide film on to the surface of a substrate of extended lateral dimensions, said method comprising the steps of:
(a) arranging a cathode assembly whose overall lateral dimensions are not substantially less than those of the substrate in the vicinity of the substrate and substantially parallel thereto, but spaced apart therefrom so as to define a working space between the cathode assembly and the substrate surface, the cathode assembly comprising a plurality of elongated, side-by-side strips comprising a metal capable of being reactively sputtered, said strips being spaced apart to define passages therebetween;
(b) enclosing the cathode assembly and the substrate within a vacuum chamber containing a sputtering atmosphere of oxygen and another non-reactive gas or gases at a controlled reduced pressure;
(c) maintaining the substrate at a controlled elevated temperature in the vacuum chamber;
(d) applying a high negative potential to the cathode assembly so as to cause deposition of a metal oxide film on the substrate by reactive sputtering; and
(e) oscillating the cathode assembly back and forth in a direction transverse to the length of the strips and substantially parallel to the area of the substrate to be coated with the film, through an amplitude substantially smaller than the overall length of the cathode assembly;
the improvement comprising:
(f) controllably varying the thickness of the deposited film over the area of the substrate by varying the effective width of each of the cathode strips along its length so as to provide that the effective width of each of the cathode strips at any point along its length, which point in use is traversed past a corresponding part of the area of the substrate, is such as to deposit a film of required thickness on that part of the area of the substrate, whereby the film has a controlled variation in resistance over the surface of the substrate.

51. A method as recited in claim 50 wherein said strips are maintained substantially parallel during the sputtering process.

52. A method according to claim 50, wherein the effective widths of the cathode strips are varied by the use of a series of cathode strips which differ in width from one another.

53. A method according to claim 50, wherein the effective widths of the cathode strips are varied by the use of a series of cathode strips which are tapered in width along their length.

54. A method according to claim 50, wherein the effective widths of the cathode strips are varied by the use of masks applied to a series of equally-spaced cathode strips having substantially equal dimensions to one another.

55. A method according to claim 54, wherein the widths of at least some of the cathode strips exposed by the masks vary along their length.

56. A method according to claim 54, wherein the masks expose different widths of successive cathode strips.

* * * * *